United States Patent
Iyer et al.

(10) Patent No.: US 11,538,764 B2
(45) Date of Patent: Dec. 27, 2022

(54) FLEXIBLE AND STRETCHABLE INTERCONNECTS FOR FLEXIBLE SYSTEMS

(71) Applicant: THE REGENTS OF THE UNIVERSITY OF CALIFORNIA, Oakland, CA (US)

(72) Inventors: Subramanian S. Iyer, Los Angeles, CA (US); Arsalan Alam, Los Angeles, CA (US); Amir Hanna, Los Angeles, CA (US); Takafumi Fukushima, Miyagi (JP)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/965,934

(22) PCT Filed: Jan. 30, 2019

(86) PCT No.: PCT/US2019/015840
§ 371 (c)(1),
(2) Date: Jul. 29, 2020

(87) PCT Pub. No.: WO2019/152512
PCT Pub. Date: Aug. 8, 2019

(65) Prior Publication Data
US 2021/0074648 A1    Mar. 11, 2021

Related U.S. Application Data

(60) Provisional application No. 62/624,587, filed on Jan. 31, 2018.

(51) Int. Cl.
*H05K 1/00* (2006.01)
*H01L 23/538* (2006.01)
*H01L 21/48* (2006.01)

(52) U.S. Cl.
CPC ...... *H01L 23/5387* (2013.01); *H01L 21/4814* (2013.01); *H01L 23/5386* (2013.01); *H01L 2221/1073* (2013.01)

(58) Field of Classification Search
USPC .................................................. 174/250
See application file for complete search history.

(56) References Cited

U.S. PATENT DOCUMENTS

| 2015/0366050 A1 | 12/2015 | Noh et al. |
| 2016/0049384 A1 | 2/2016 | Lu et al. |
| 2016/0381789 A1 | 12/2016 | Rogers et al. |

FOREIGN PATENT DOCUMENTS

| WO | WO-2016/178902 A1 | 11/2016 |
| WO | WO-2018/081705 A1 | 5/2018 |

OTHER PUBLICATIONS

Fukushima et al., "FlexTrate TM—Scaled Heterogeneous Integration of Flexible Biocompatible Substrates using FOWLP", 6 pages (Jun. 1, 2007).*

(Continued)

*Primary Examiner* — Andargie M Aychillhum
(74) *Attorney, Agent, or Firm* — Foley & Lardner LLP

(57) ABSTRACT

A flexible device includes: (1) a flexible substrate; and (2) an interconnect disposed over the flexible substrate, wherein the interconnect has a varying vertical displacement along its length, relative to a top surface of the flexible substrate.

16 Claims, 15 Drawing Sheets

(56) References Cited

OTHER PUBLICATIONS

International Preliminary Report on Patentability and Written Opinion for PCT/US2019/015840 dated Aug. 13, 2020 (11 pages).
Fukushima, et al., "FlexTrate^TM—Scaled Heterogeneous Integration on Flexible Biocompatible Substrates using FOWLP", 6 pages (Jun. 1, 2007).
International Search Report and Written Opinion, issued in Int'l. Appln. No. PCT/US2019/015840, 12 pages (dated Apr. 24, 2019).
Iyer, "Revisiting Amdahl's Wafer Scale Integration with Advanced Packaging Moore's Law for Heterogeneous Integration", Center for Heterogeneous Integration and Performance Scaling, 48 pages (Dec. 17, 2015).

* cited by examiner

FLEXIBLE AND STRETCHABLE INTERCONNECTS FOR FLEXIBLE SYSTEMS

CROSS-REFERENCE TO RELATED APPLICATION

This application is a National Stage Entry of International Application No. PCT/US2019/015840, filed Jan. 30, 2019, which claims the benefit of U.S. Provisional Application No. 62/624,587, filed Jan. 31, 2018, the contents of which are incorporated herein by reference in their entirety.

STATEMENT REGARDING FEDERALLY SPONSORED RESEARCH OR DEVELOPMENT

This invention was made with Government support under Grant Number N00014-16-1-2639, awarded by the U.S. Navy, Office of Naval Research and under Grant Number FA8650-13-2-7311, awarded by the Air Force Research Laboratory. The Government has certain rights in the invention.

TECHNICAL FIELD

This disclosure generally relates to flexible and stretchable interconnects.

BACKGROUND

The use of Fan-Out Wafer Level Packaging (FOWLP) is proliferating to many of latest portable electronic products. This process readily integrates high performance heterogeneous dies, along with sustaining tight pitch interconnects. To date, FOWLP has been implemented using rigid molding compounds resulting in rigid substrates. Furthermore, interconnects themselves are rigid and lack adequate flexibility.

It is against this background that a need arose to develop the embodiments described herein.

SUMMARY

In some embodiments, a flexible device includes: (1) a flexible substrate; and (2) an interconnect disposed over the flexible substrate, wherein the interconnect has a varying vertical displacement along its length, relative to a top surface of the flexible substrate.

In some embodiments of the device, the interconnect includes multiple interconnected corrugated segments.

In some embodiments of the device, the flexible substrate has multiple trenches extending into the flexible substrate relative to the top surface of the flexible substrate, and the interconnect extends over the top surface of the flexible substrate and into the trenches of the flexible substrate.

In some embodiments of the device, the corrugated segments include a first segment extending along a first direction parallel to the top surface of the flexible substrate, a second segment extending along a second direction non-parallel to the top surface of the flexible substrate and the second direction forms a non-zero angle with the first direction, and a third segment extending along a third direction parallel or non-parallel to the top surface of the flexible substrate and the third direction forms a non-zero angle with the second direction.

In some embodiments of the device, the flexible substrate has corrugations in a checkerboard pattern, and the interconnect extends over the corrugations of the flexible substrate.

In some embodiments of the device, the interconnect includes multiple interconnected concave segments.

In some embodiments of the device, the flexible substrate has multiple depressions extending into the flexible substrate relative to the top surface of the flexible substrate, and the concave segments extend into corresponding ones of the depressions.

In some embodiments of the device, the interconnect is a first interconnect, the device includes multiple interconnects disposed over the flexible substrate and including the first interconnect, and each of the interconnects has a varying vertical displacement along its length, relative to the top surface of the flexible substrate.

In some embodiments of the device, a pitch between adjacent ones of the interconnects is from several hundreds of microns to a few microns (e.g., less than about 10 µm). In some embodiments, the pitch is up to about 100 µm.

In some embodiments of the device, the interconnect is a first interconnect, the device includes: a layer disposed over the flexible substrate and the first interconnect; and a second interconnect disposed over the layer, wherein the second interconnect has a varying vertical displacement along its length, relative to a top surface of the layer.

In additional embodiments, a flexible device includes: (1) a flexible substrate; (2) a device component embedded in the flexible substrate while an active surface of the device component is exposed from the flexible substrate, wherein the device component includes a bonding pad adjacent to the active surface; (3) a stress buffer layer disposed over the flexible substrate and the device component, wherein the stress buffer layer defines an opening exposing the bonding pad of the device component; and (4) an interconnect disposed over the stress buffer layer and electrically connected to the bonding pad of the device component through the opening of the stress buffer layer, wherein the interconnect has a varying vertical displacement along its length, relative to a top surface of the stress buffer layer.

In some embodiments of the device, the interconnect includes multiple interconnected corrugated segments.

In some embodiments of the device, the stress buffer layer has multiple trenches extending into the stress buffer layer relative to the top surface of the stress buffer layer, and the interconnect extends over the top surface of the stress buffer layer and into the trenches of the stress buffer layer.

In additional embodiments, a process of forming a flexible device includes: (1) providing a flexible substrate having a vertically varying surface region; and (2) forming an interconnect over the vertically varying surface region of the flexible substrate.

In some embodiments of the process, providing the flexible substrate includes forming the flexible substrate having multiple trenches in the vertically varying surface region, and the interconnect extends over a top surface of the flexible substrate and into the trenches of the flexible substrate.

In some embodiments of the process, forming the flexible substrate includes patterning the flexible substrate to form the trenches.

In some embodiments of the process, providing the flexible substrate includes forming the flexible substrate having multiple depressions in the vertically varying surface region, and the interconnect includes multiple interconnected concave segments extending into corresponding ones of the depressions.

In some embodiments of the process, providing the flexible substrate includes contacting the flexible substrate with a mold including multiple protrusions to form the flexible substrate having the depressions corresponding to the protrusions of the mold.

In further embodiments, a process of forming a flexible device includes: (1) providing a flexible substrate and a device component embedded in the flexible substrate while an active surface of the device component is exposed from the flexible substrate, wherein the device component includes a bonding pad adjacent to the active surface; (2) forming a stress buffer layer over the flexible substrate and the device component, wherein forming the stress buffer layer includes forming an opening in the stress buffer layer exposing the bonding pad of the device component, and further includes forming the stress buffer layer having a vertically varying surface region; and (3) forming an interconnect over the vertically varying surface region of the stress buffer layer and electrically connected to the bonding pad of the device component through the opening of the stress buffer layer.

In some embodiments of the process, forming the stress buffer layer includes forming the stress buffer layer having multiple trenches in the vertically varying surface region, and the interconnect extends over a top surface of the stress buffer layer and into the trenches of the stress buffer layer.

In some embodiments of the process, providing the flexible substrate and the device component includes: disposing an adhesive layer over a handler; selectively heating a region of the adhesive layer to form multiple protrusions in the selectively heated region of the adhesive layer; affixing the device component to the adhesive layer and the handler, with the active surface of the device component facing the adhesive layer; applying a flexible material over the device component and the adhesive layer; and curing the flexible material to form the flexible substrate in which the device component is embedded, and having multiple depressions corresponding to the protrusions in the selectively heated region of the adhesive layer.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

in FIG. 11(a) and about 30 s for about 105° C. in FIG. 11(b). Demonstration of VeRzag interconnect in FIG. 11(c).

DETAILED DESCRIPTION

Through a flexible FOWLP process, a flexible and stretchable substrate can be implemented with multiple dies interconnected at fine pitch (e.g., as low as about 10 μm or less). To render an overall system truly flexible and stretchable, it is desired for high pitch interconnects themselves to be stretchable. Here, embodiments are directed to approaches to form flexible and stretchable high pitch interconnects, including interconnects referred as "VeRzag" interconnects and vertically corrugated interconnects, which are integrated in a flexible FOWLP process. These approaches can produce flexible and stretchable interconnects that do not compromise on high density and fine pitch of the interconnects. It should be noted that the approaches described here for forming VeRzag interconnects and vertically corrugated interconnects are not restricted to flexible FOWLP process, but can be applied for any flexible system, including flexible hybrid electronic devices. Examples of applications of flexible systems include applying the systems to non-planar surfaces (e.g., curvilinear surfaces that are concave or convex), in vivo applications such as medical implants, pills, and so forth, and external patch applications such as surface electromyography systems (sEMG).

Figure 1:
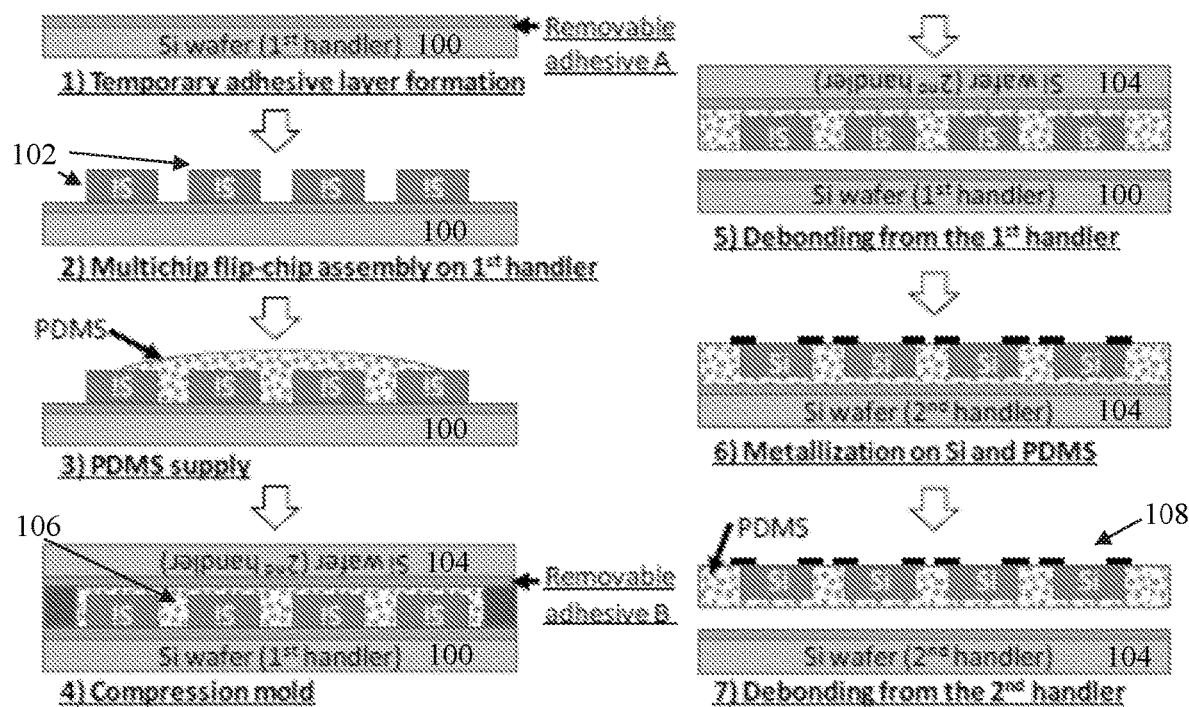
FIG. 1. A process flow of fabrication of a device using flexible FOWLP according to some embodiments.

FIG. 1 shows a process flow and intermediate structures during fabrication of a device by a flexible FOWLP according to some embodiments.

First, a removable adhesive layer A is disposed or formed over a first handler 100, such as a silicon wafer or other silicon carrier. The first handler 100 can be conveyed and secured by a wafer bonder. As depicted in FIG. 1, the adhesive layer A is a thermally removable adhesive layer, although adhesive layers that are photochemically removable also can be used. Specifically, the adhesive layer A is thermally removable at a first release temperature or a first release temperature range, such as about 90° C. to about 120° C. The adhesive layer A can be formed of an adhesive which is applied by spinning or other coating technique. A thickness of the adhesive layer A can be up to about 100 µm, up to about 90 µm, up to about 80 µm, up to about 70 µm, up to about 60 µm, up to about 50 µm, up to about 40 µm, up to about 30 µm, up to about 20 µm, up to about 15 µm, up to about 5 µm, or up to about 1 µm.

Then, semiconductor components 102 in the form of small dies are disposed over the adhesive layer A and are affixed to the adhesive layer A active side down, with their active surfaces facing the adhesive layer A. Placement of the semiconductor components 102 in an array can be performed using a die bonder, a die tray, or capillary self-assembly. In some embodiments, placement of multiple ones of the semiconductor components 102 can be performed in parallel, such as through multi-die assembly. An insulating material is optionally disposed over side surfaces and back surfaces of the semiconductor components 102.

After that, a flexible material (or a precursor thereof), such as a flexible resin like a biocompatible polydimethylsiloxane (PDMS), is applied over the die-on-handler structure. Specifically, the flexible material is applied over the semiconductor components 102 and the adhesive layer A by spinning or other coating technique, followed by curing and compression molding using a compression mold system. As depicted in FIG. 1, compression molding is performed with a second handler 104 having a removable adhesive layer B applied over the flexible material covering the semiconductor components 102. The adhesive layer B is a thermally removable adhesive layer, although adhesive layers that are photochemically removable also can be used. Specifically, the adhesive layer B is thermally removable at a second release temperature or a second release temperature range which is greater than the first release temperature of the adhesive layer A, such as about 150° C. or above. Compression molding is performed at a temperature or a temperature range below the first release temperature of the adhesive layer A and below the second release temperature of the adhesive layer B, such that the flexible material and the semiconductor components 102 remain affixed to the adhesive layers A and B. As a result, a flexible substrate 106 is formed in which the semiconductor components 102 are embedded.

Next, multi-die transfer from the first handler 100 to the second handler 104 is performed. Specifically, the flexible substrate 106 and the semiconductor components 102 are released from the adhesive layer A and the first handler 100 by heating to the first release temperature of the adhesive layer A, while the flexible substrate 106 and the semiconductor components 102 remain affixed to the adhesive layer B.

With the active surfaces of the semiconductor components 102 exposed, metallization processing is next performed over the array of the semiconductor components 102 and a top surface of the flexible substrate 106 at a wafer level, thereby forming a passivation layer, a stress buffer layer, interconnects, a flexible layer, and fan-out contacts and electrodes.

Finally, a resulting flexible device 108 is released from the adhesive layer B and the second handler 104 by heating to the second release temperature of the adhesive layer B. A thickness of the flexible device 108 can be controlled to be relatively thin to lend greater flexibility to the device 108. Control over the thickness can be performed by controlling an amount of the flexible material applied to cover the semiconductor components 102, without requiring grinding or chemical-mechanical polishing. For example, the thickness of the flexible device 108 can be up to a few hundred µm, or up to about 500 µm, up to about 400 µm, up to about 300 µm, up to about 200 µm, or up to about 150, and down to about 100 µm or less.

Figure 2:
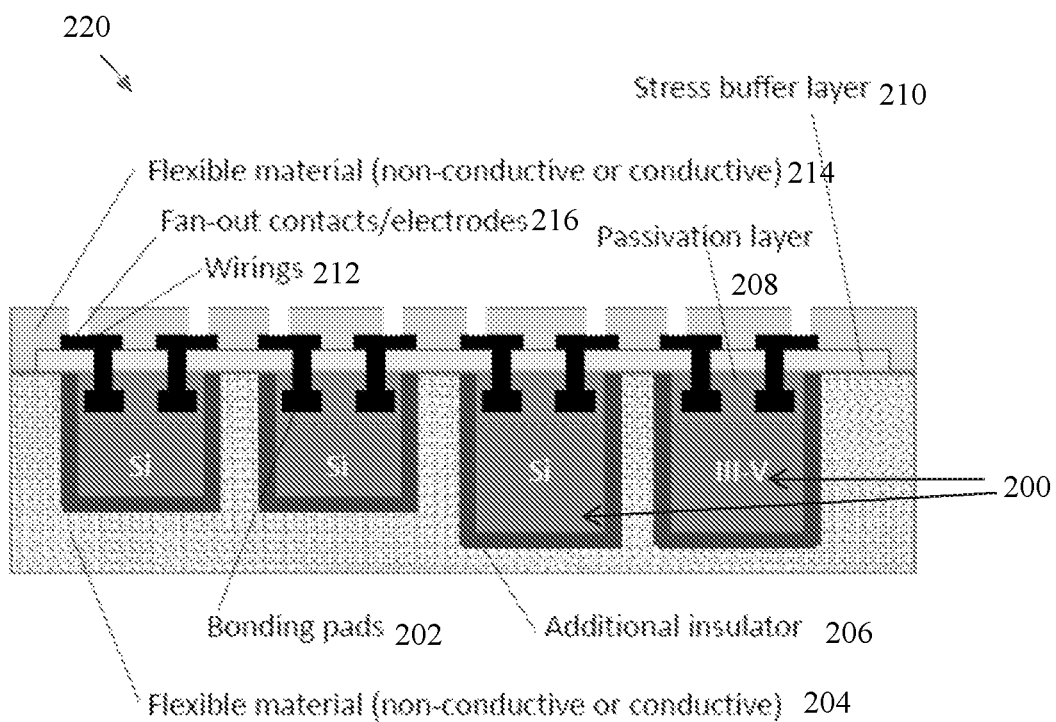
FIG. 2. Structure of a flexible device according to some embodiments.

FIG. 2 illustrates a structure of a resulting flexible device 220 according to some embodiments. As shown in FIG. 2, the device 220 is a fan-out wafer level package, and includes multiple device components in the form of semiconductor components 200 each including multiple bonding pads 202. As illustrated, the semiconductor components 200 are inorganic semiconductor dies, such as dies based on, or including, Si, a III-V semiconductor, or other inorganic semiconductors. Although four semiconductor components 200 are shown in FIG. 2, more or less semiconductor components 200 can be included in other embodiments. In general, a variety of device components can be included, such as energy storage components, passive device components (e.g., inductors, capacitors, resistors, memristors, and so forth), active device components (e.g., processors, memory dies, and so forth), light-emitting diodes, lasers, imaging device components, radio device components, microelectromechanical system (MEMS) components, and sensors, amongst others.

The semiconductor components 200 are embedded into a flexible substrate 204, which serves as an encapsulant covering side surfaces and back surfaces of the semiconductor components 200, while top, active surfaces of the semiconductor components 200 are exposed from the flexible substrate 204. The semiconductor components 200 can have different thicknesses, although the top surfaces of the semiconductor components 200 can be substantially coplanar with respect to one another, such that a distance (e.g., in terms of a vertical displacement along a direction perpendicular to a top surface of the flexible substrate 204) between a highest point and a lowest point among the top surfaces is up to about 30 µm, up to about 20 µm, up to about 10 µm, up to about 5 µm, up to about 3 µm, or up to about 1 µm or less. Also, the top surfaces of the semiconductor components 200 can be substantially coplanar with respect to the top surface of the flexible substrate 204, such that a distance (e.g., in terms of a vertical displacement along a direction perpendicular to the top surface of the flexible substrate 204) between the top surface of each semiconductor component 200 and the top surface of the flexible substrate 204 is up to about 30 µm, up to about 20 µm, up to about 10 µm, up to about 5 µm, up to about 3 µm, or up to about 1 µm or less. As shown in FIG. 2, an insulating material 205 is optionally disposed between the side surfaces and the back surfaces of the semiconductor components 200 and the flexible substrate 204.

The flexible substrate 204 is formed of, or includes, a flexible or soft material, which, in general, can be an insulating material or a conductive material. Suitable flexible materials can have one or both of the following properties: 1) relatively soft with a Young's modulus of up to about 3 GPa, up to about 1 GPa, up to about 500 MPa, up to about 100 MPa, up to about 90 MPa, up to about 80 MPa, up to about 70 MPa, up to about 60 MPa, up to about 50 MPa, up to about 40 MPa, up to about 30 MPa, up to about 20 MPa, up to about 10 MPa, up to about 5 MPa, up to about 3 MPa, up to about 2 MPa, up to about 1 MPa, or up to about 0.1 MPa; and 2) relatively high percentage elongation-at-break of at least about 5%, at least about 10%, at least about 20%, at least about 30%, at least about 50%, at least about 70%, at least about 100%, at least about 150%, at least about 200%, at least about 300%, or at least about 400%, and up to about 500% or more. Some suitable flexible materials can have a low glass transition temperature below room temperature or below about 25° C., such as no greater than about 20° C., no greater than about 10° C., no greater than about 0° C., no greater than about −5° C., no greater than about −10° C., no greater than about −15° C., or no greater than about −20° C., and down to about −30° C., down to about −50° C., or down to about −120° C. or less, although other suitable flexible materials can have a glass transition temperature at or above room temperature. Examples of suitable flexible materials include elastomers (e.g., silicones (such as PDMS), polyurethanes, or polyacrylates) and materials derived or formed from thermo- or photo-curable resins (e.g., epoxy resins, polyimide, or gels). Additional examples include conductive materials including a metal or a metal alloy (e.g., titanium (Ti), platinum (Pt), and so forth).

As shown in FIG. 2, the device 220 also includes a passivation layer 208 disposed over and covering the top surfaces of the semiconductor components 200. The passivation layer 208 is formed of, or includes, an insulating material. Examples of suitable insulating materials include resins (e.g., polyimide, polybenzoxazole (PBO), or epoxy-based photoresist (such as SU-8)) and dielectric materials (e.g., oxides such as $SiO_2$). The passivation layer 208 is formed with, or defines, openings or through holes exposing the bonding pads 202 of the semiconductor components 200.

A stress buffer layer 210 is included so as to be disposed over the flexible substrate 204 and the semiconductor components 200 and covering a top surface of the passivation layer 208 and the top surface of the flexible substrate 204. The stress buffer layer 210 is formed of, or includes, an insulating material. Examples of suitable insulating materials include resins (e.g., epoxy-based photoresist (such as SU-8) or parylenes). The stress buffer layer 210 is formed with, or defines, openings or through holes, which are aligned with openings of the passivation layer 208 so as to expose the bonding pads 202 of the semiconductor components 200.

As shown in FIG. 2, interconnects 212 in the form of wirings are disposed over the stress buffer layer 210 and include portions extending into the openings of the stress buffer layer 210 and the passivation layer 208 so as to electrically connect to the bonding pads 202 of the semiconductor components 200. Portions of the interconnects 212 extend over the stress buffer layer 210 beyond a lateral periphery of at least one semiconductor component 200. Although not explicitly depicted in FIG. 2, at least some of the interconnects 212 can be electrically connected to one another, or can be integrally formed with one another, so as to electrically connect the semiconductor components 200 and form a functional system.

A flexible layer 214 is included so as to be disposed over the flexible substrate 204 and the semiconductor components 200 and covering a top surface of the stress buffer layer 210, the top surface of the flexible substrate 204, and the interconnects 212. The flexible layer 214 is formed of, or includes, a flexible or soft material, which, in general, can be an insulating material or a conductive material. Examples of suitable flexible materials include those discussed above for the flexible substrate 204. The flexible layer 214 is formed with, or defines, openings or through holes, which expose fan-out portions of the interconnects 212. A fan-out structure is disposed over the exposed fan-out portions of the interconnects 212, and includes fan-out contacts and fan-out electrodes 216 which are electrically connected to the bonding pads 202 of the semiconductor components 200 through the interconnects 212. The fan-out contacts 216 are configured for external connection to another device and are formed of, or include, a conductive material such as a metal or metal alloy (e.g., copper (Cu) or gold (Au)) or a solder, and the fan-out electrodes 216 are configured for sensing or applying a stimulation and are formed of, or include, a conductive material such as a metal or metal alloy (e.g., platinum (Pt) or Au), a metal oxide (e.g., $IrO_2$), or a conductive polymer (e.g., poly(3,4-ethylenedioxythiophene) or PEDOT). Although some embodiments are explained above in which interconnects 212 are disposed over a stress buffer layer 210, other embodiments are encompassed in which the stress buffer layer 210 is optionally omitted, and interconnects 212 are disposed over a flexible substrate and are formed and configured in a similar manner as explained above for the stress buffer layer 210.

In some embodiments, a general approach to form flexible and stretchable interconnects is to form a vertically varying surface (e.g., in the form of depressions or corrugations) on which the interconnects are formed. Forming interconnects on such non-planar surface can yield a total interconnect length greater than a minimum distance between die connecting points. The additional length of the interconnects is what renders the interconnects as bendable and stretchable. This is because when a flexible substrate in a flexible FOWLP system or another flexible system is bent or stretched, it would strain the interconnects accordingly. If the interconnects are directly connected as straight lines to dies, the interconnects can readily crack as metal interconnects can have an about 0.2% strain limit. The about 0.2% strain limit is a relatively small value in terms of stretchability and renders the interconnects as almost non-stretchable. However, having vertically corrugated or otherwise vertically extending structures can allow interconnects to stretch accordingly in order to withstand the stress from either bending or stretching of a flexible substrate or another flexible system in a way that does not allow any segment of VeRzag interconnects or vertically corrugated interconnects to sustain stresses more than an ultimate tensile strength (UTS) of a material of the interconnects. A bending or stretching limit of the system would be specified when the interconnects can no longer change its shape under an increased bending or stretching of the system and would ultimately break irreversibly. Such a situation would specify the flexible system's bendability or stretchability limit.

Both VeRzag interconnects and vertically corrugated interconnects can be formed of, or can include, a conductive material, such as a metal or metal alloy (e.g., Au or Cu) or a stretchable conductive material (e.g., an alloy, nanoparticles, or another suitable material for stretchable interconnects). To obtain desired interconnects, electron-beam (e-beam) evaporation or sputtering is performed for metallization, followed by patterning of a resulting deposited metal layer by photolithography or another technique, and followed by either wet etching or dry etching. A resulting interconnect follows or conforms to a non-planar surface to yield a vertically varying structure. Here, although details of a general fabrication process of metal interconnects are explained, other fabrication processes can also be employed depending on a material used for interconnects. A vertically varying surface can be designed to provide VeRzag interconnects and vertically corrugated interconnects that are sinusoidal, horse shoe, rectangular, triangular or have other shapes. Design dimensions of the non-planar surface can be adjusted to attain a desired overall bendability or stretchability of a flexible system. Overall, the VeRzag interconnects and vertically corrugated interconnects allow for implementing bendable, stretchable, fine pitch, thin or thick and high-performance interconnects. In the following, approaches are explained to form flexible and stretchable high pitch interconnects, referred as VeRzag interconnects, and to form vertically corrugated interconnects, which are integrated in a flexible FOWLP process.

VeRzag Interconnects:

VeRzag interconnects stand for vertical random zigzag interconnects. "Random" is used because a non-planar surface is randomly created in this approach, as explained in the following sections. Moreover, "zigzag" is used as desired bendable and stretchable vertical interconnects approximately take a zigzag route when connected to dies in order to provide bendability and stretchability to the interconnects. The interconnects are vertically zigzag in shape, and a structure of the interconnects may be approximately sinusoidal, horse shoe, rectangular, triangular or another shape.

A) VeRzag Interconnects Approach 1

In a flexible FOWLP process, a thermally removable adhesive layer A (e.g., an adhesive tape) is disposed on a first handler. Heating of certain regions of the adhesive layer A above a first release temperature where the adhesive layer A loses its adhesion properties results in random hemispherical expansion of a surface of the adhesive layer A in those regions. This is because the adhesive layer A can include a thermal release layer formed of an expandable polymer that expands to several times its original volume when heated above the first release temperature, thus allowing the adhesive layer A to lose its adhesiveness. The first release temperature of the adhesive layer A can be about 90° C., or about 100° C., or about 120° C. or more but should be less than a second release temperature of an adhesive layer B, which can be about 150° C., or about 160° C., or about 170° C. or more.

Figure 3:
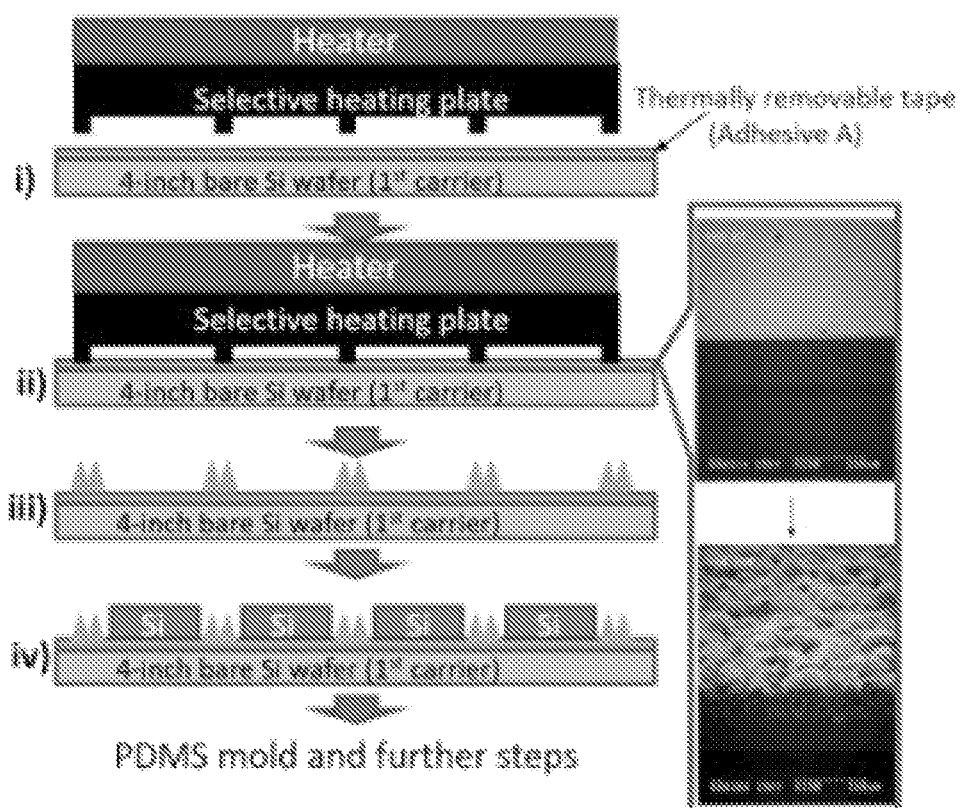
FIG. 3. Process flow of approach 1 of integrating vertical random zigzag (VeRzag) interconnects into a flexible FOWLP process according to some embodiments.

After affixing the adhesive layer A over the first handler, a pre-patterned silicon wafer (or another pre-patterned heating plate) is disposed on the adhesive layer A such that protruding portions of the silicon wafer contact selected areas of the adhesive layer A, where selective expansion of the adhesive layer A tape is desired. The expansion of the selected areas of the adhesive layer A will specify regions where VeRzag interconnects will be formed. The thermally removable adhesive layer A is heated at the selected areas for forming interconnects, after stage 1 of the flexible FOWLP process flow, as depicted in FIG. 3.

To heat the adhesive layer A above its first release temperature, a heater can be disposed over the silicon wafer that can transfer heat from the heater through the silicon wafer to the adhesive layer A at selected regions where the protruding portions contact the adhesive layer A. These regions of the adhesive layer A undergo thermal expansion and result in a non-planar surface. A representative scanning electron microscope (SEM) image before and after heating of an adhesive tape (Nitto Denko Corp.) is shown in an inset image of FIG. 3(*ii*).

The heated adhesive layer A includes both planar surface regions and non-planar surface regions at selected areas. Dies, as part of the flexible FOWLP process, are then disposed over the planar surface regions of the adhesive layer A with, for example, a pick and place tool. After that, a flexible material, such as PDMS, is applied over the dies and the adhesive layer A by spinning or other coating technique, and then the flexible material is covered with a second handler having an adhesive layer B and the flexible material is cured. The flexible material can be cured at any temperature below the first release temperature of the adhesive layer A. A surface of the flexible material in contact with the adhesive layer A will take on a negative imprint structure of the adhesive layer A after curing. A resulting flexible substrate and the embedded dies are released from the adhesive layer A and the first handler by heating to the first release temperature of the adhesive layer A, while the flexible substrate and the dies remain affixed to the adhesive layer B.

The exposed surface of the flexible substrate with the dies embedded therein includes both planar surface regions and non-planar surface regions. It is over these non-planar surface regions where stretchable and bendable VeRzag interconnects can be formed. These interconnects can be formed of, or can include, a conductive material, such as a metal or metal alloy (e.g., Au or Cu) or a stretchable conductive material (e.g., an alloy, nanoparticles, or another suitable material for stretchable interconnects). To obtain desired interconnects, e-beam evaporation or sputtering is performed for metallization, followed by patterning of a resulting deposited metal layer by photolithography or another technique, and followed by either wet etching or dry etching. A resulting interconnect follows or conforms to a non-planar surface of the flexible substrate to yield a vertically varying structure. Although details of a general fabrication process of metal interconnects are explained, other fabrication processes can also be employed depending on a material used for interconnects.

Direct metallization on the flexible substrate may lead to crack formation of a metal layer due to a large coefficient of thermal expansion (CTE) mismatch between the flexible material and the metal. Therefore, to reduce the CTE mismatch, a stress buffer layer (including a material such as a parylene, SU-8, or another material having a CTE between that of the metal and the flexible substrate) can be formed over the non-planar flexible substrate. Such stress buffer layer also aids in reducing a roughness of the surface of the flexible substrate and providing control over a depth of non-planar imprints in the stress buffer layer. As the imprints are approximately hemispherical in shape, resulting hemispherical structures of interconnects can provide bendability or stretchability of the interconnects along multiple directions. Specifically, the adhesive layer A can be heated to above its first release temperature for a specified temperature and time duration, where randomly formed hemispherical protrusions are formed on its top surface and the uncured flexible material can be disposed over the top surface of the adhesive layer A. After curing the flexible material (e.g., for about 24 hrs at about 25° C.) using the second handler, as part of the flexible FOWLP process, the first handler is removed and a negative imprint of the non-planar hemispherical surface is imparted on the cured surface of the flexible substrate that was in contact with the adhesive layer A. A stress buffer layer is then formed by chemical vapor deposition (CVD), spinning, or another deposition technique over the non-planar surface of the flexible substrate. The stress buffer layer generally follows or conforms to a surface topology of the flexible substrate and can be used to provide a desired surface profile for formation of VeRzag interconnects of desired shapes and dimensions in further fabrication stages. With the aid of photolithography, openings can be formed through the stress buffer layer to connect the underlying dies in the flexible substrate with the interconnects in further fabrication stages.

Figure 4:
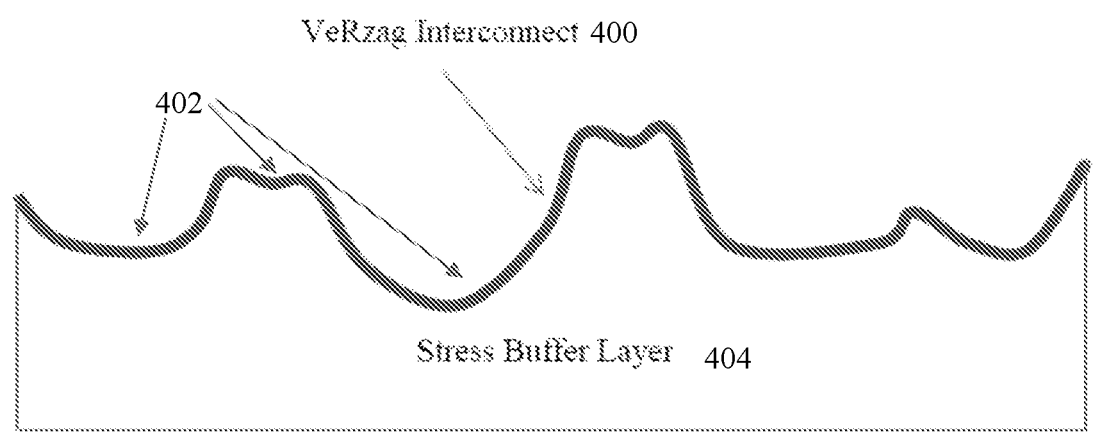
FIG. 4. Cross-sectional schematic of a structure of a VeRzag interconnect formed over a stress buffer layer according to some embodiments.

FIG. 4 shows a cross-sectional schematic of a structure of a VeRzag interconnect 400 formed over a stress buffer layer according to some embodiments. As shown in FIG. 4, the interconnect includes multiple interconnected (and integrally formed) concave segments 402 extending into corresponding depressions formed in a stress buffer layer 404. Alternatively, or in conjunction, convex segments can be formed in the interconnect 400.

B) VeRzag Interconnects Approach 2

Figure 5:
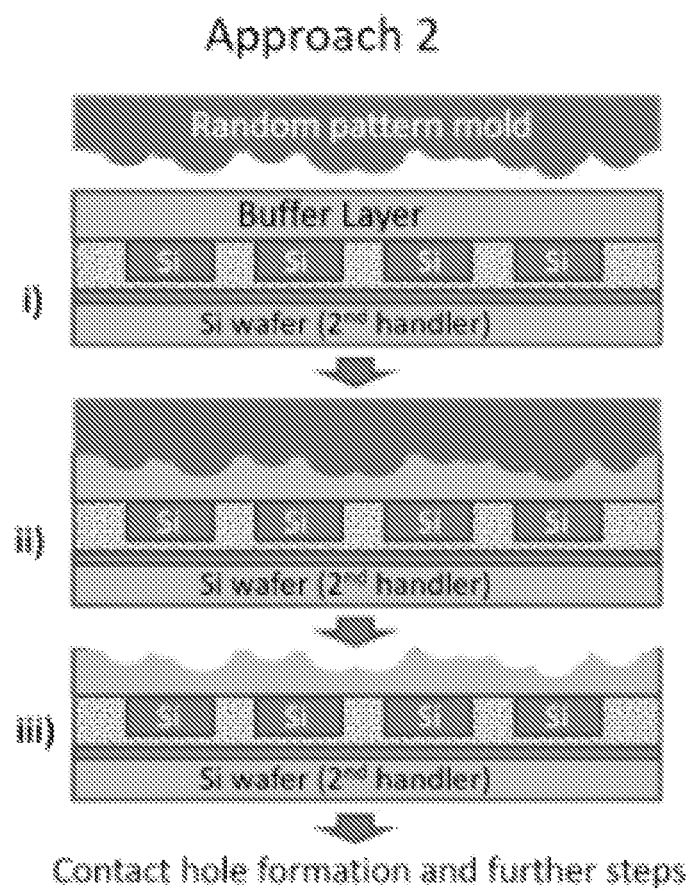
FIG. 5. Process flow of forming VeRzag interconnects using approach 2 according to some embodiments.

This approach is a modified form of approach 1 of forming VeRzag interconnects. A process flow for approach 2 of forming VeRzag interconnects is shown in FIG. 5. After debonding of a first handler in a flexible FOWLP process, a stress buffer layer (e.g., a layer of SU-8) is formed by spinning or another deposition technique over a planar flexible substrate with embedded dies. Another adhesive layer A is then thermally triggered over substantially its entire surface to form a random patterned mold, and its thermally expanded hemispherical surface is maintained in contact over the curing stress buffer layer. After curing of the stress buffer layer, the expanded adhesive layer A is removed and a negative imprint of its non-planar hemispherical surface is imparted on a cured surface of the stress buffer layer that was in contact with the expanded adhesive layer A.

In such manner, stretchable and bendable VeRzag interconnects can then be formed over the stress buffer layer. These interconnects can be formed of, or can include, a conductive material, such as a metal or metal alloy (e.g., Au or Cu) or a stretchable conductive material (e.g., an alloy, nanoparticles, or another suitable material for stretchable interconnects). To obtain desired interconnects, e-beam evaporation or sputtering is performed for metallization, followed by patterning of a resulting deposited metal layer by photolithography or another technique, and followed by either wet etching or dry etching. A resulting interconnect follows or conforms to the non-planar surface of the stress buffer layer to yield a vertically varying structure. Although details of a general fabrication process of metal interconnects is explained, other fabrication processes can also be employed depending on a material used for interconnects. By using a thermally expanded surface of an adhesive layer as a mold, a random hemispherical surface profile is imparted on the stress buffer layer without requiring fabrication stages such as photolithography.

C) Vertically Corrugated Interconnects

Figure 6:
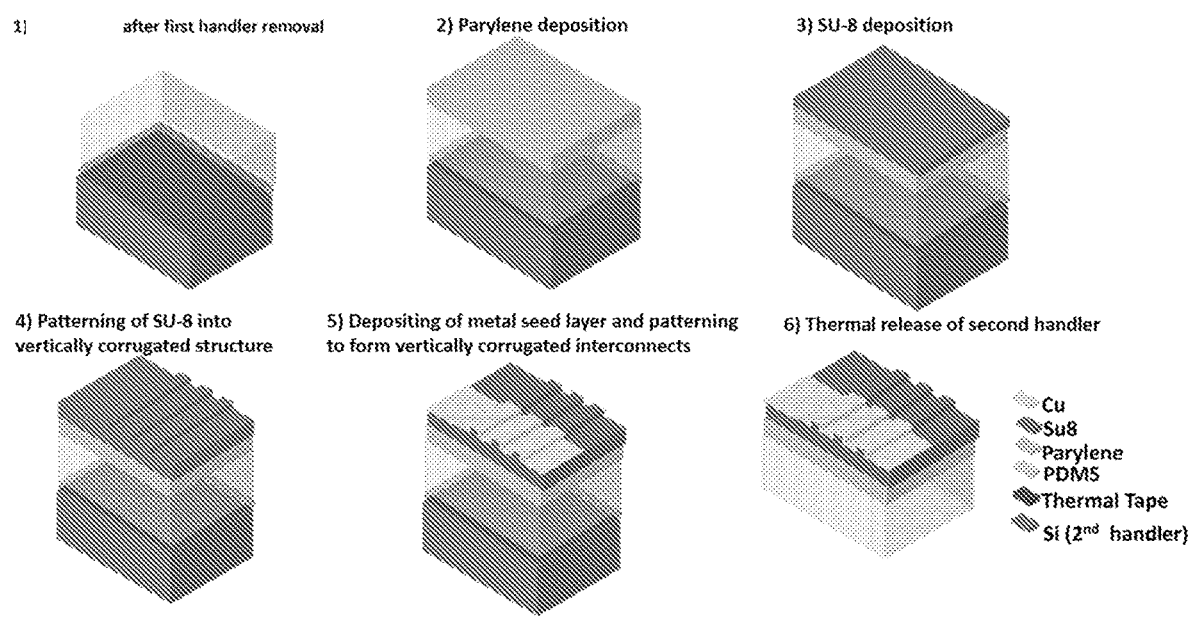
FIG. 6. Process flow for forming vertically corrugated interconnects according to some embodiments.
Figure 7:
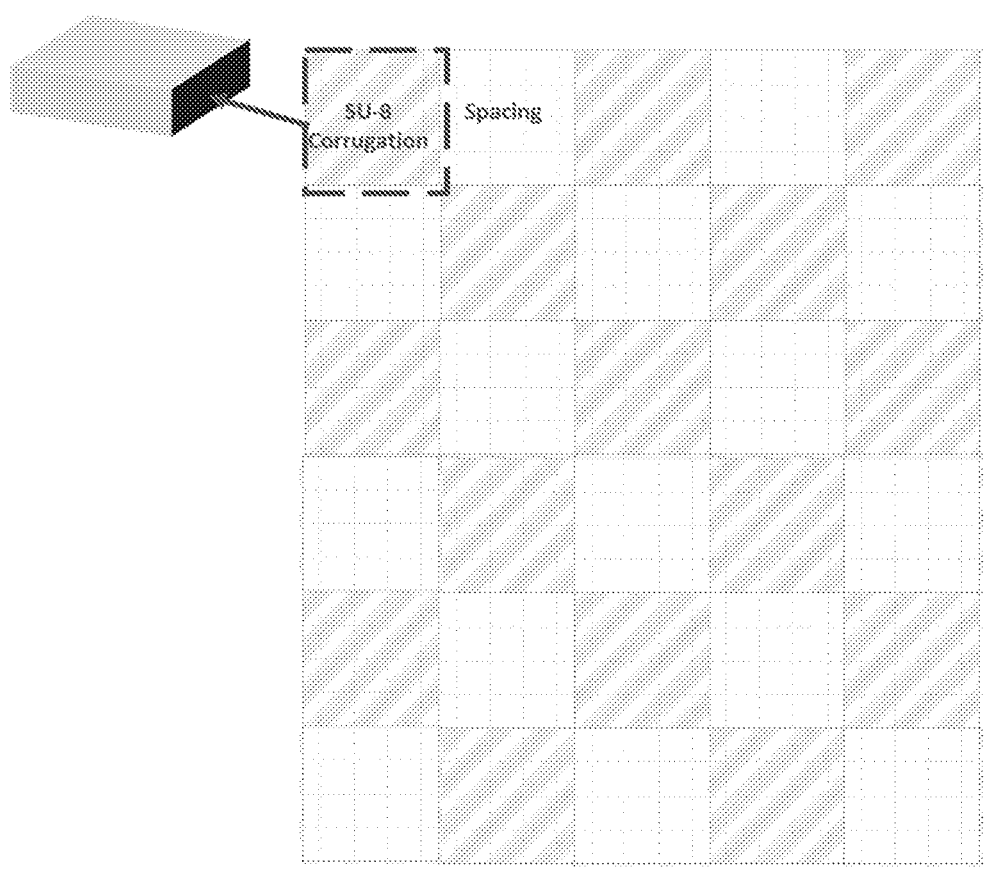
FIG. 7. Checkerboard design of a non-planar vertically corrugated structure according to some embodiments.

In this approach, after release of a first handler in a flexible FOWLP process and formation of one or more stress buffer layers on a flexible substrate, designed masks are used to form vertically corrugated patterns on the stress buffer layers. A process flow for formation of vertically corrugated interconnects is shown in FIG. 6. Materials for stress buffer layers can be SU-8, parylene, or other suitable materials or combinations of such materials. Considering deposition of parylene followed by spin coating of SU-8 as the stress buffer layers, for example, photolithography is used to form depressions in the form of trenches partially extending through the SU-8 layer, as shown in stage 4 of FIG. 6. Since parylene deposition can result in a relatively high surface roughness, the additional layer of thin SU-8 can be deposited for planarization, prior to another thick layer of deposited SU-8. A thickness of the thin SU-8 layer can vary from about 0.5 µm to about 10 µm. For planarization purpose, apart from SU-8, other appropriate polymers can also be used. It should be noted that a thickness of the thick SU-8 layer will specify an amplitude or a depth of vertically corrugated interconnects and can be selected according to a desired design of the interconnects. It can vary from about 0.5 µm to about 20 µm; however, other values beyond this range can be selected depending on the design of the vertically corrugated interconnects. Moreover, a length, a width and a pitch (spacing between centerlines) of the trenches are parameters that specify a length, a width and a pitch, respectively of the vertically corrugated interconnects. A pitch of the trenches (and of the resulting interconnects) can vary from up to about 500 µm, up to about 400 µm, up to about 300 µm, up to about 200 µm, up to about 100 µm, up to about 80 µm, up to about 60 µm, up to about 40 µm, or up to about 20 µm, and down to about 10 µm or less. Depending on the design of the trenches in SU-8, the resulting vertically corrugated interconnects can be sinusoidal, horse shoe, rectangular, triangular or other shapes. The non-planar vertically corrugated surface of SU-8 acts as a designed template to perform metallization to obtain the vertically corrugated interconnects. Moreover, non-planar corrugations on SU-8 can also be designed in the form of a checkerboard where one segment (e.g., square or rectangular) of the checkerboard design is made of non-planar vertically corrugated SU-8 and an adjacent segment (e.g., square or rectangular) is left vacant for spacing, as shown in FIG. 7. When interconnects are formed on such as checkerboard surface, such interconnects are readily flexible and stretchable in both x-y directions of the plane. The length and width of each segment of the checkerboard is a design parameter and can be varied from about 0.5 µm to a few mm's. Here, non-planar corrugations can be made on any other suitable material and is not restricted to SU-8. The checkerboard can have random sizes of different large and small squares, or different large and small rectangular shapes. The shape is not restricted to a checkerboard and can have random circular shapes of different diameters.

The interconnects can be formed of, or can include, a conductive material, such as a metal or metal alloy (e.g., Au or Cu) or a stretchable conductive material (e.g., an alloy, nanoparticles, or another suitable material for stretchable interconnects). To obtain desired interconnects, e-beam evaporation or sputtering is performed for metallization, followed by patterning of a resulting deposited metal layer by photolithography or another technique, and followed by either wet etching or dry etching. The resulting interconnects follow or conform to the corrugated surface of the stress buffer layer to yield vertically varying structures.

Figure 8:
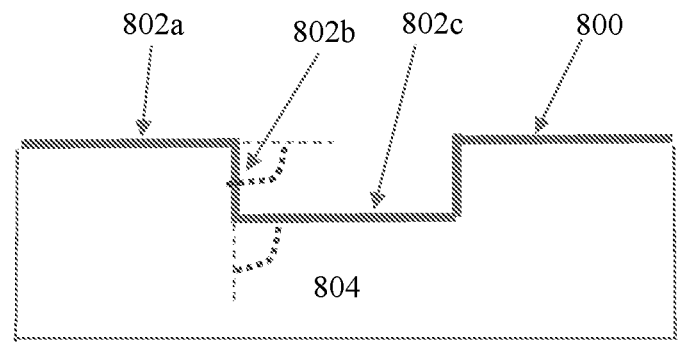
FIG. 8. Cross-sectional schematic of a structure of a vertically corrugated interconnect formed over a stress buffer layer according to some embodiments.
Figure 9:
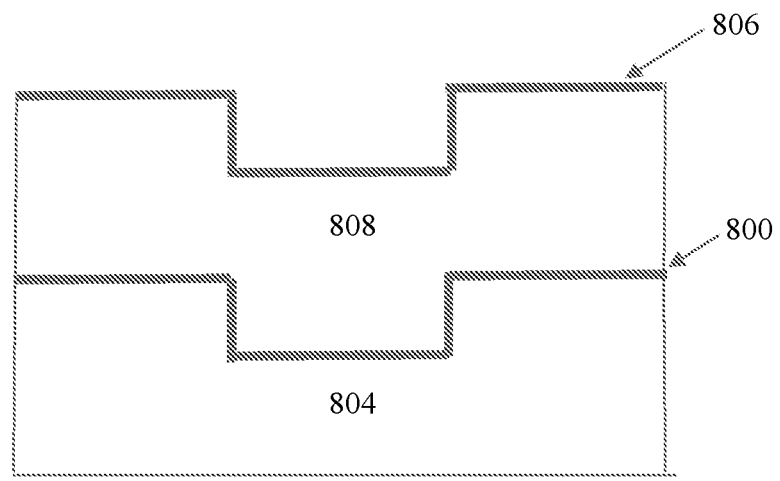
FIG. 9. Cross-sectional schematic of a structure of a multi-level corrugated interconnect structure.

As shown in FIG. 8, a resulting vertically corrugated interconnect 800 includes multiple interconnected (and integrally formed) segments 802 extending over a top surface of a stress buffer layer 804 and into the trenches of the stress buffer layer 804, where a first segment 802a extends along a first direction parallel to the top surface of the stress buffer layer 804, a second segment 802b extends along a second direction non-parallel to the top surface of the stress buffer layer 804 and the second direction forms a non-zero angle with the first direction in a range of about 30° to about 90°, a third segment 802c extends along a third direction parallel or non-parallel to the top surface of the stress buffer layer 804 and the third direction forms a non-zero angle with the second direction in a range of about 30° to about 90°, and so forth. Also, as shown in FIG. 9, by further performing a fabrication process of depositing and patterning another stress buffer layer 808 over the interconnect 800 and the stress buffer layer 804, and forming another vertically corrugated interconnect 806 over a top surface of the stress buffer layer 808 and extending into trenches of the stress buffer layer 808, a multi-level corrugated interconnect structure is attained. The vertically corrugated interconnects 800 and 806 at different levels of the multi-level structure can extend laterally along directions that are parallel or non-parallel (e.g., can extend cross-wise). Although details of a general fabrication process of metal interconnects are explained, other fabrication processes can also be employed depending on a material used for interconnects.

Figure 10:
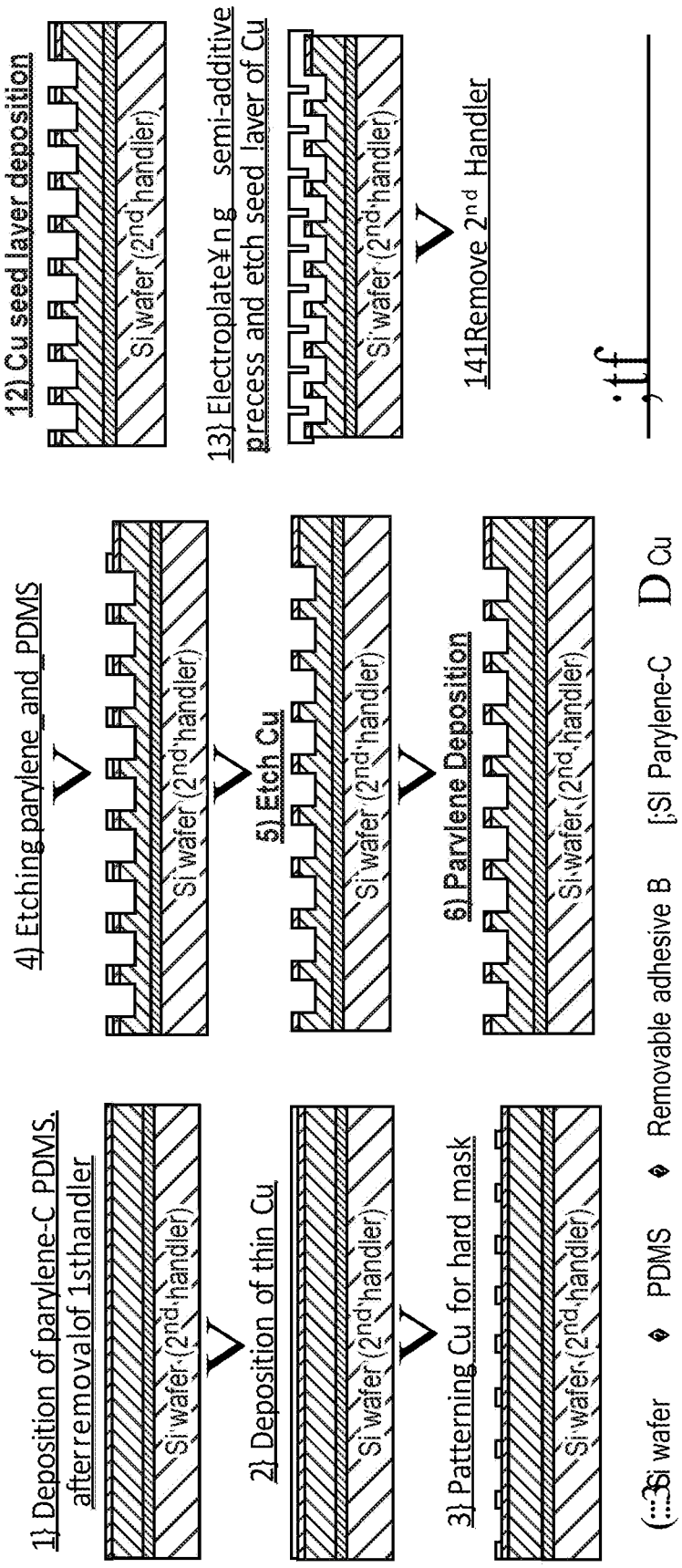
FIG. 10. Process flow of another approach to forming vertically corrugated interconnects according to some embodiments.

Another modified approach to forming vertically corrugated interconnects is shown in FIG. 10. Here, after the removal of the first handler in the fabrication process, a thin layer of parylene is deposited by CVD process followed by a thin layer of Cu deposition either by sputtering or e-beam evaporation. The deposited Cu layer is then patterned by wet etching to act as a hard mask and reactive ion etching (RIE) is used to etch through parylene and PDMS surface to a specified depth (e.g., from about 0.5 µm to a few mm's), to form trenches of a corrugated surface, as shown in stage 4 of FIG. 10. After attaining the specified depth of the trenches, Cu can be etched away and a thin parylene layer is again deposited by CVD process. Cu seed layer is then deposited, and Cu interconnects are defined and electroplated using a semi-additive process. After electroplating, the Cu seed layer can be etched and the second handler can be removed to obtain the corrugated interconnects. The parylene layer can vary from about 0.5 µm to about 1 µm in thickness, or another thickness beyond or below this range can be selected. Cu seed layer thickness can be less than about 1 µm in thickness, and other materials can be used as the hard mask. Another modified approach is to form non-planar corrugations on a surface of a flexible substrate (e.g., PDMS), form a stress buffer layer over the flexible substrate (e.g., a thin layer of parylene) that follows or conforms to the corrugations, and then form the interconnects, by performing e-beam evaporation or sputtering for metallization, followed by patterning of a resulting deposited metal layer by photolithography or another technique, and followed by either wet etching or dry etching. The resulting interconnects follow or conform to the corrugated surface of the stress buffer layer. A thin layer of parylene can be deposited prior to metallization since direct metallization on the flexible substrate may lead to cracking of a metal layer. The parylene layer can vary from about 0.5 µm to about 1 µm in thickness or another thickness beyond this range can be selected. In place of parylene, another suitable material for a stress buffer layer material can be used. An advantage of using parylene is that it can be conformally deposited by CVD and, hence, follows a non-planar corrugated structure of the flexible substrate.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Experimental

VeRzag Interconnects

An adhesive tape A having a release temperature of about 90° C. was placed on a first silicon handler. As heating temperature and heating time of the adhesive tape A play a role in determining the formation of hemispherical bumps on the tape surface, the heating temperature and heating time of the adhesive tape A are first optimized. An uncured flexible substrate material, biocompatible PDMS, was applied over the adhesive tape A, which was heated to about 90° C. for about 90 s and a second handler with an adhesive tape B having a release temperature of about 170° C. was placed over the uncured PDMS. The uncured PDMS was allowed to cure for about 24 hrs at about 25° C. and the first handler along with the adhesive tape A were removed by heating the adhesive tape A to about 90° C. for about 120 s. The cured PDMS now had a negative imprint structure of the selectively heated adhesive tape A. A layer of about 1 µm parylene acting as a stress buffer layer was then deposited by CVD over the non-planar PDMS. A thin seed layer of about 10 nm titanium (Ti) followed by about 600 nm of Cu was then sputtered on the parylene and Cu interconnects of about 100 µm width were patterned using a photolithography process. The Cu interconnects were then electroplated to about 15 µm thickness. The second handler was heated to about 170° C. to release the adhesive tape B, thereby yielding a flexible device. Various bending tests are performed on the device. Dies were not placed on the adhesive tape A in this demonstration of the implementation of VeRzag interconnects. However, dies can also be placed and the same procedure can be followed to obtain VeRzag interconnects.

Vertically Corrugated Interconnects

An adhesive tape A having about 90° C. as its release temperature was placed on an about 300 mm silicon wafer used as a first handler. Uncured biocompatible PDMS was poured over the adhesive tape A and was allowed to cure at about 25° C. for about a day through compression molding using a second handler with an adhesive tape B (release temperature of about 170° C.). After curing of PDMS, the first handler along with the adhesive tape A were removed by heating to about 90° C. for about 120 s. Parylene-C of about 1 µm thickness was deposited over the PDMS through CVD followed by spin coating a thin layer of SU-8 of about 1.6 µm thickness for planarization followed by spin coating of about 10 µm thick SU-8. Photolithography was used to form periodic vertically corrugated structures on the SU-8, having a pitch of about 22.5 µm with about 12.5 µm spacing. Vertically corrugated interconnects were formed by depositing about 600 nm Cu by sputtering on the non-planar corrugated structure of SU-8 and patterning through photolithography and wet etching. A semi-additive process was used to electroplate Cu to a desired thickness. The second handler along with the adhesive tape B were removed by heating to about 170° C. for about 120 s to obtain a flexible device with corrugated interconnects. It should be noted that several planar Cu interconnects were also fabricated in the device to perform comparative evaluation of vertically corrugated versus planar interconnects. Dies were not placed on the adhesive tape A in this demonstration of the implementation of vertically corrugated interconnects. However, dies can also be placed and the same procedure can be followed to obtain vertically corrugated interconnects.

Results and Discussion:

VeRzag Interconnects

Figure 11:
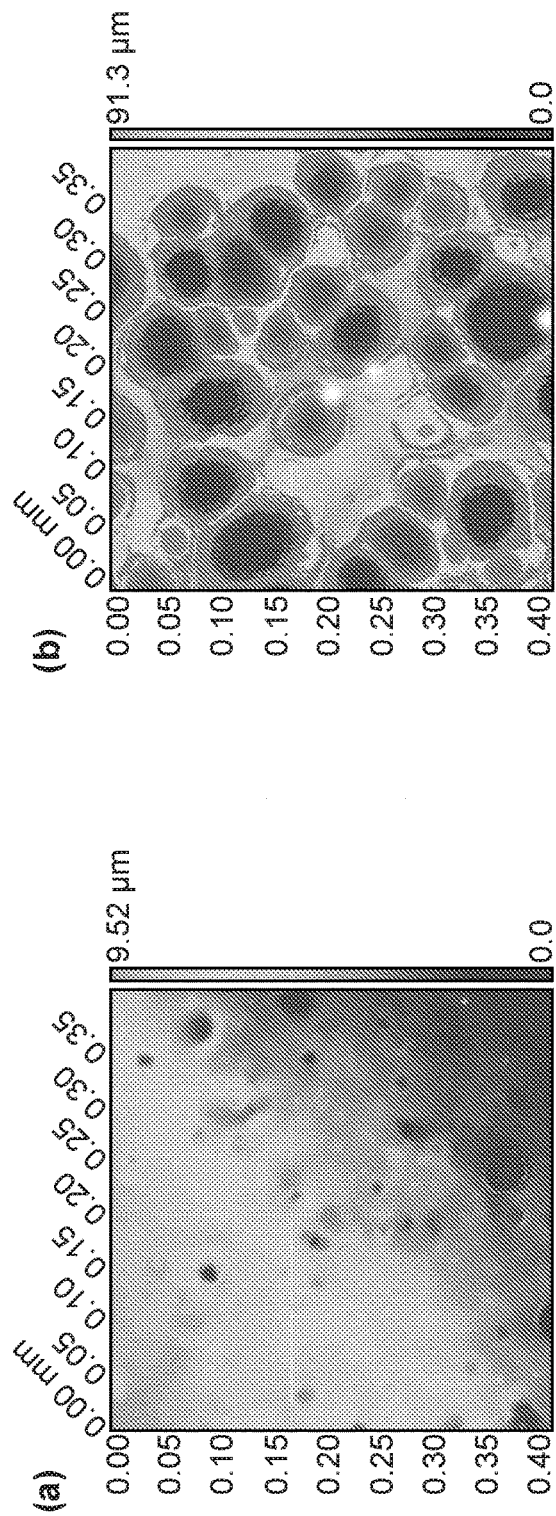
FIG. 11. 20× zoomed optical image of a surface of polydimethylsiloxane (PDMS) when selectively heating an adhesive tape A for about 15 s at about 90° C.
Figure 11:
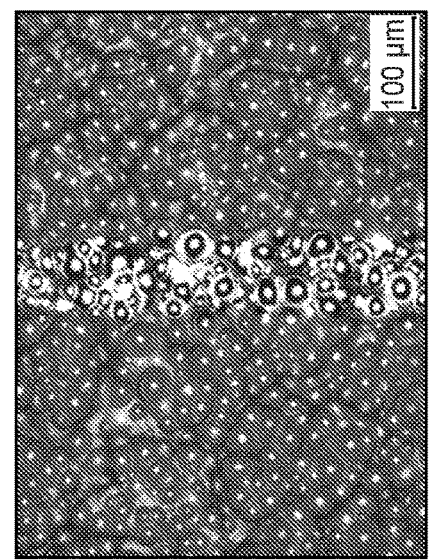

The structure of the surface of the cured PDMS for different time periods and temperatures of selective heating of the adhesive tape A is shown in FIG. 11. It is observed that for a heating temperature of about 90° C. and a heating time of about 15 s, few random hemispherical imprints are formed on the PDMS surface (FIG. 11(a)). However, by increasing the heating temperature to about 105° C. and heating time to about 30 s, a significant number of random hemispherical imprints are formed on the PDMS surface (FIG. 11(b)). The depth of these hemispherical imprints on PDMS lie in the range of about 10-30 μm. Hence, these results indicate that the imprinted PDMS surface provides a good template to perform metallization that can result in VeRzag interconnects. Moreover, such a surface also can provide stretchability to the device in multiple directions due to the hemispherical shape of the imprints. The number of hemispherical imprints and their dimensions can be controlled on the PDMS surface by optimizing the heating time and heating temperature during the selective heating stage of the adhesive tape A. Fabrication of VeRzag interconnects is shown in FIG. 11(c).

Figure 12:
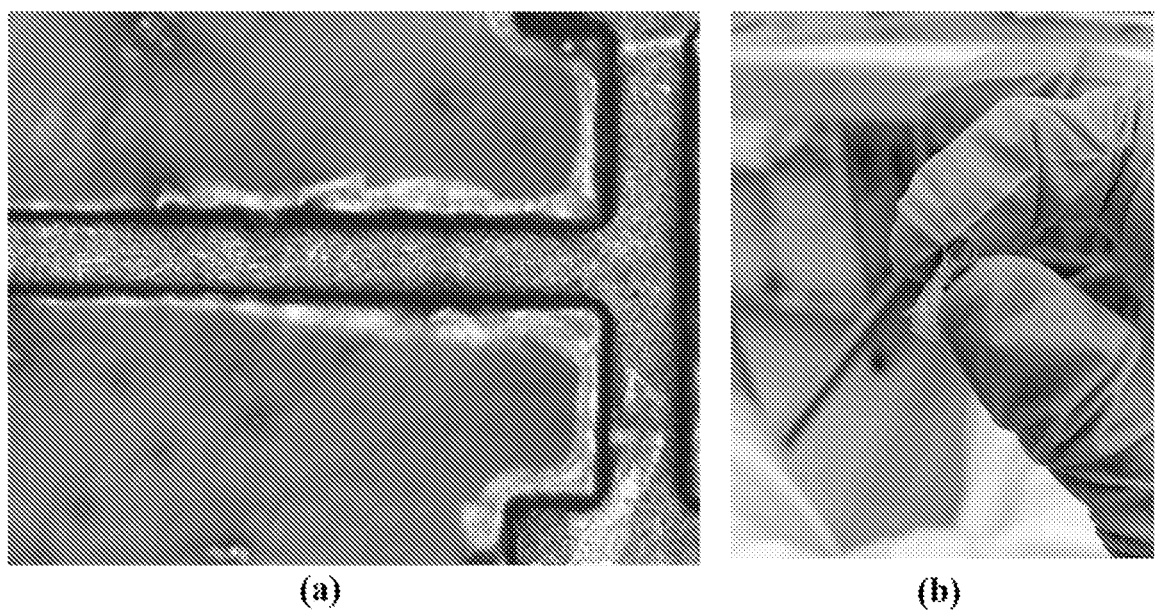
FIG. 12. Optical image of VeRzag interconnects on a non-planar random surface in FIG. 12(a), and rolling of a flexible sample with VeRzag interconnects in FIG. 12(b).

An optical image (2.5× magnification) of electroplated metal interconnects on a non-planar PDMS surface with about 1 μm parylene deposition is shown in FIG. 12(a). Here, the adhesive tape A was heated to about 90° C. for about 90 s to form a non-planar hemispherical surface on the PDMS. The average resistance of 9 interconnects of about 10 mm length was measured to be about 2.5 Ohms (Ω) prior to bending. A bending test is performed on the flexible sample for 500 bending cycles, each at bending radii of about 30 mm, about 15 mm, about 5 mm and about 2.5 mm. The results are summarized in Table I. It is observed that after bending none of the metal interconnects were broken and there was about 10% increase in resistance. Moreover, the sample is rolled as shown in FIG. 12(b). The interconnects did not break post-rolling and the average resistance post-rolling was about 2.8Ω (about 12% increase from the original resistance value). Therefore, it is observed that this approach of forming interconnects is highly reliable and can sustain extreme bending (about 2.5 mm bending radius) and rolling. This approach of forming VeRzag interconnects allows the fabrication of reliable, bendable and stretchable fine pitch interconnects.

TABLE I

Electrical characterization of VeRzag interconnects post-bending.

| # Bending Cycle | Bending Radius (mm) | Avg. R (Ω) | Electrical Reliability |
|---|---|---|---|
| 500 | 30 | 2.72 | 100% |
| 500 | 15 | 2.75 | 100% |
| 500 | 5 | 2.75 | 100% |
| 500 | 2.5 | 2.78 | 100% |

Vertically Corrugated Interconnects

A flexible sample with both vertically corrugated and planar interconnects of length of about 15 mm is formed to evaluate and compare their flexibility and electrical characteristics. Average widths of different vertically corrugated interconnects are about 116 μm, about 56 μm, about 33 μm and about 25 μm, and average widths of different planar interconnects are about 115 μm, about 50 μm and about 31 μm. The average values were calculated from 2 interconnects in each case. The flexible sample was bent at bending radii of about 10 mm, about 5 mm and about 1 mm for 1000 bending cycles in each case using a bend tester (DLDMLH-FS/Yuasa System Co., Ltd.).

Figure 13:
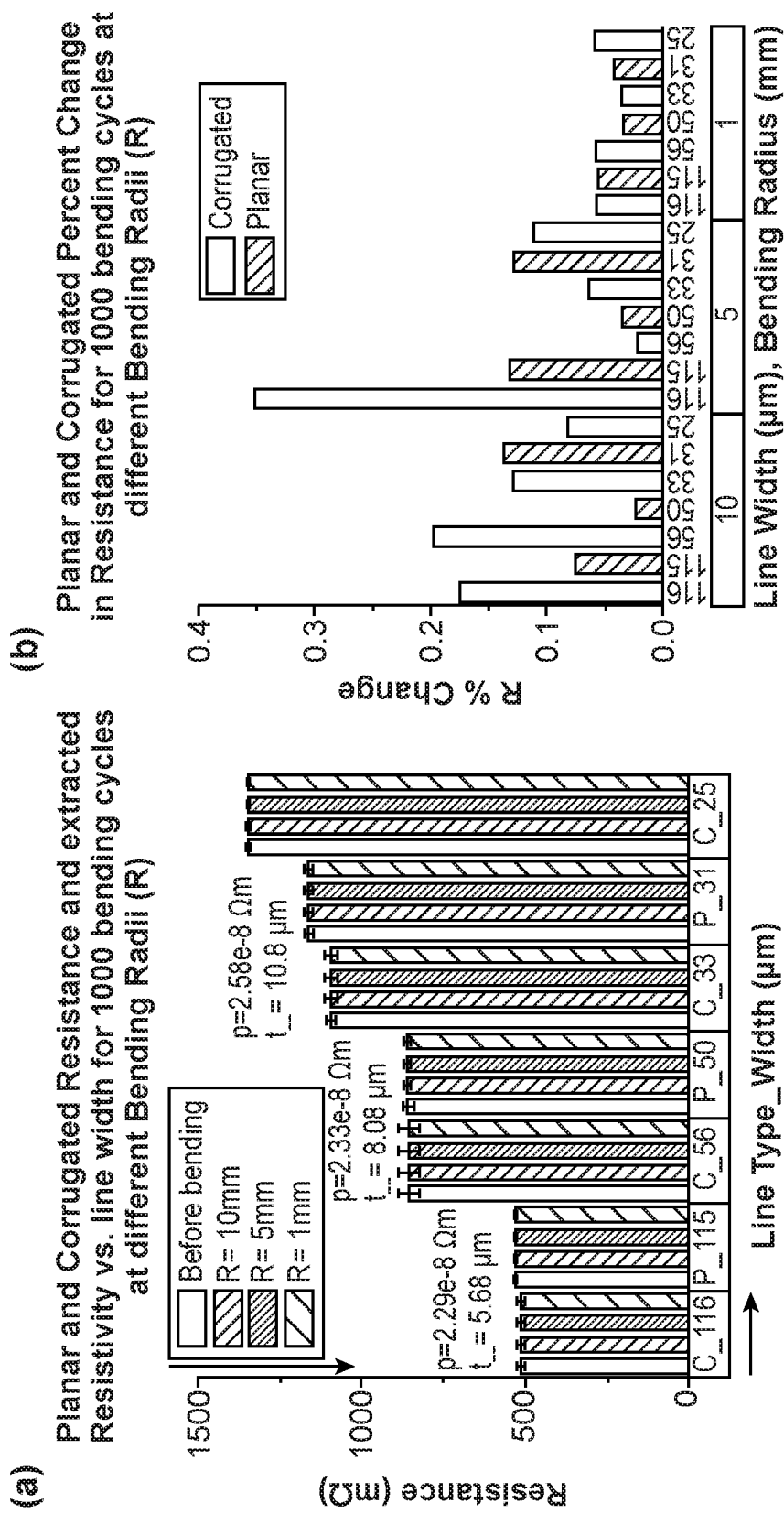
FIG. 13. Metal interconnect reliability before and after bending for 1000 cycles at R=about 10, about 5, and about 1 mm for planar and corrugated interconnects in FIG. 13(a), and change in average resistance values in FIG. 13(b).
Figure 14:
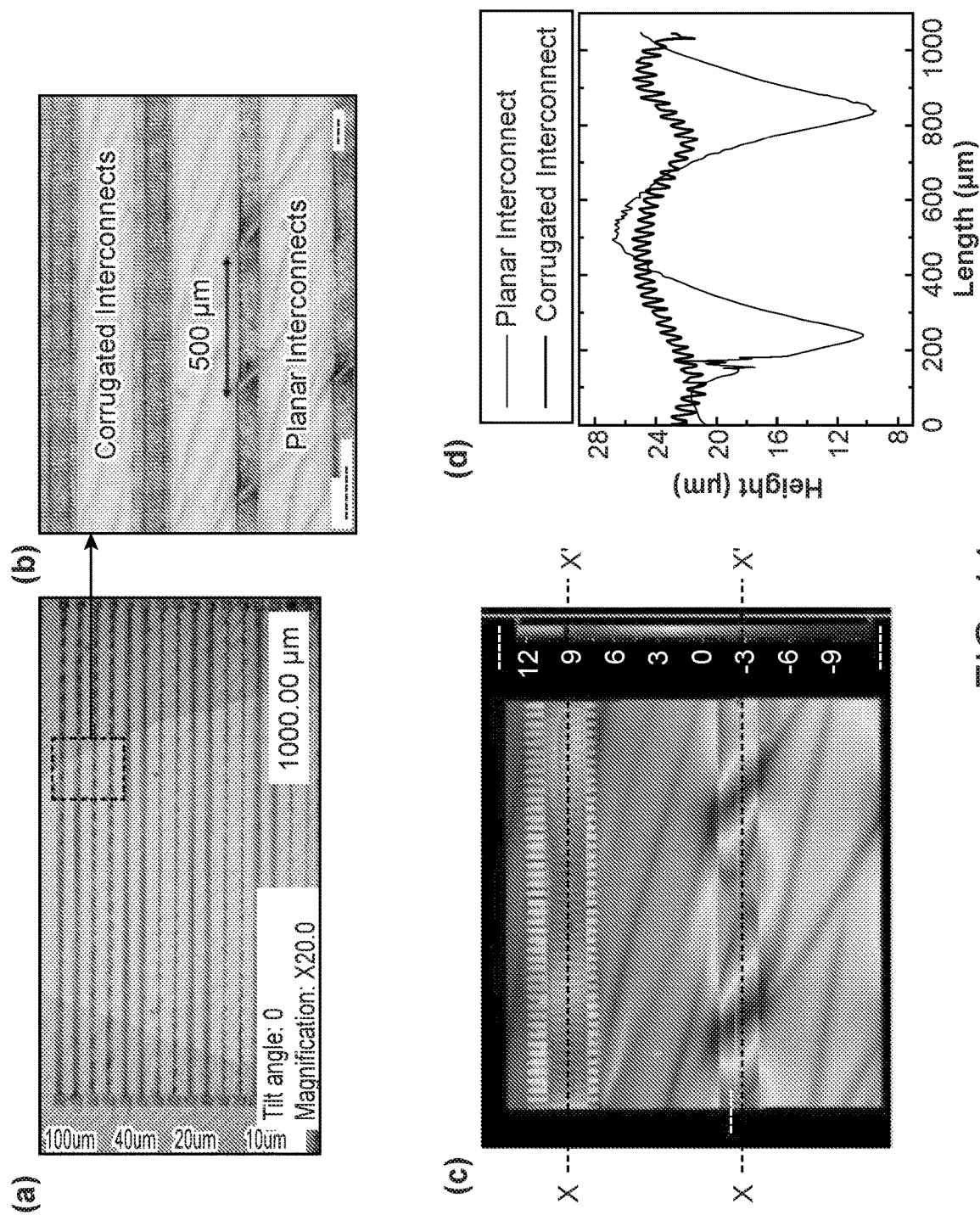
FIG. 14. Image of fabricated sample showing four different widths for planar and corrugated interconnects after mechanical bending at R=about 1 mm in FIG. 14(a). Image showing both vertically corrugated and planar interconnects where the planar interconnects exhibit major buckling with about 500 μm period in FIG. 14(b). Surface topography over the vertically corrugated and planar interconnects measured by a laser-based optical profiler in FIG. 14(c). Surface profile demonstrating about 15 μm and about 3 μm amplitude of buckling in planar and corrugated interconnects, respectively, in FIG. 14(d).

An average resistance change (with maximum and minimum resistance values) and resistivity of the interconnects, along with an average percentage change in resistance for different interconnect widths after every 1000 bending cycles at different radii is shown in FIGS. 13(a) and (b), respectively. It is observed that both vertically corrugated and planar interconnects did not break under any test condition and demonstrated <about 0.4% resistance change across all interconnect widths even under extreme bending of the sample at about 1 mm bending radius. Moreover, as shown in FIG. 14(a), post-bending at about 1 mm bending radius, the planar interconnects show buckling, whereas the vertically corrugated interconnects resist buckling. The about 115 μm wide planar interconnect exhibits buckling with about 500 μm period (FIG. 14(b)). Surface topography over the vertically corrugated and planar interconnects was measured by a laser-based optical profiler, as shown in FIG. 14(c). Amplitudes of buckling in planar and corrugated interconnects were measured to be about 15 μm and about 3 μm, respectively, as shown in FIG. 14(d). Therefore, it is observed that the planar interconnects undergo buckling which is more severe at lower bending radii, while the vertically corrugated interconnects resist buckling. The effect of buckling/wrinkling affects the mechanical integrity of subsequently deposited redistribution layers (RDLs). The vertically corrugated interconnects aid in overcoming the reliability issues resulting from buckling. Moreover, this approach of forming vertically corrugated interconnects allows the fabrication of reliable, bendable and stretchable fine pitch interconnects.

Vertically Corrugated Interconnects Connected to Semiconductor Components (Dies)

Figure 15:
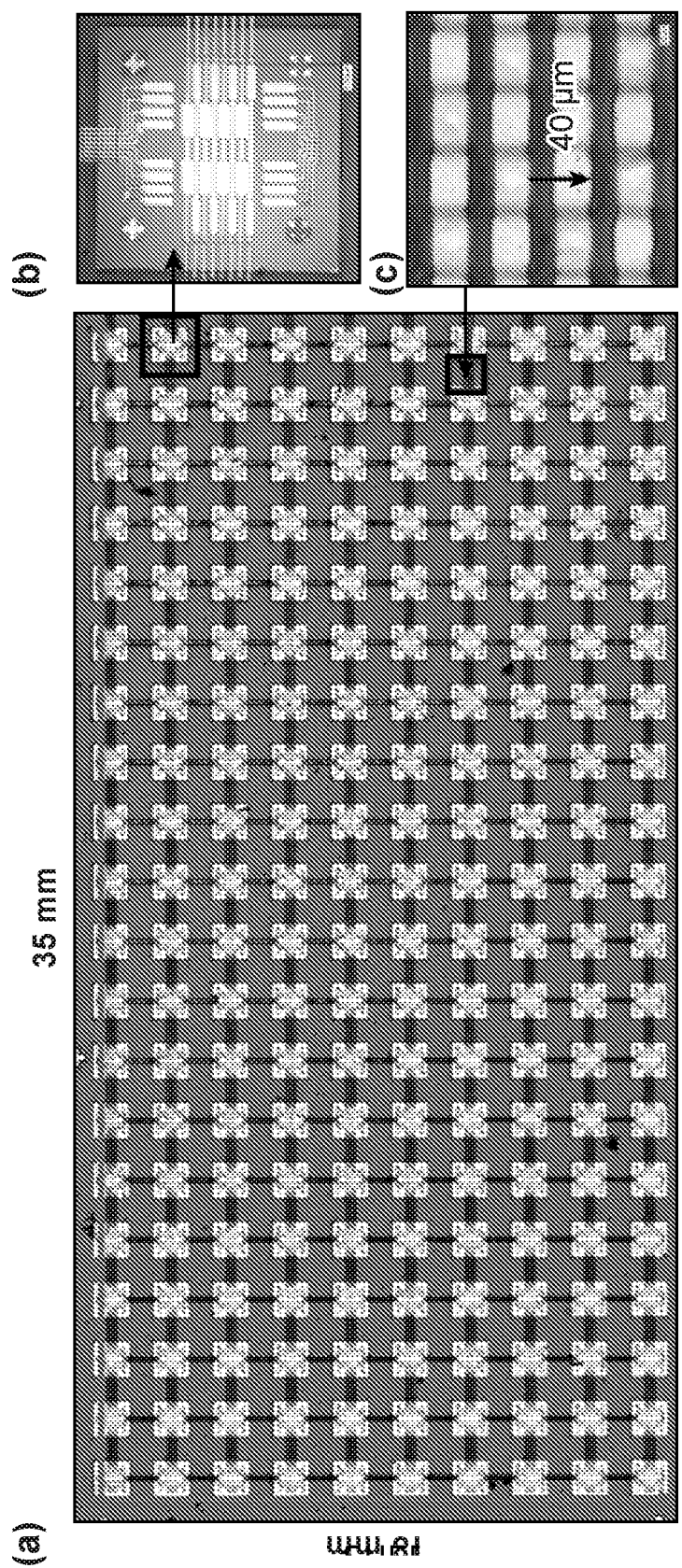
FIG. 15. Image of 10×20 array for daisy chain connected dies on a flexible system with vertically corrugated interconnects in FIG. 15(a). Zoomed-in images of a die with pads in FIG. 15(b), and vertically corrugated interconnects with about 40 μm pitch in FIG. 15(c).
Figure 16:
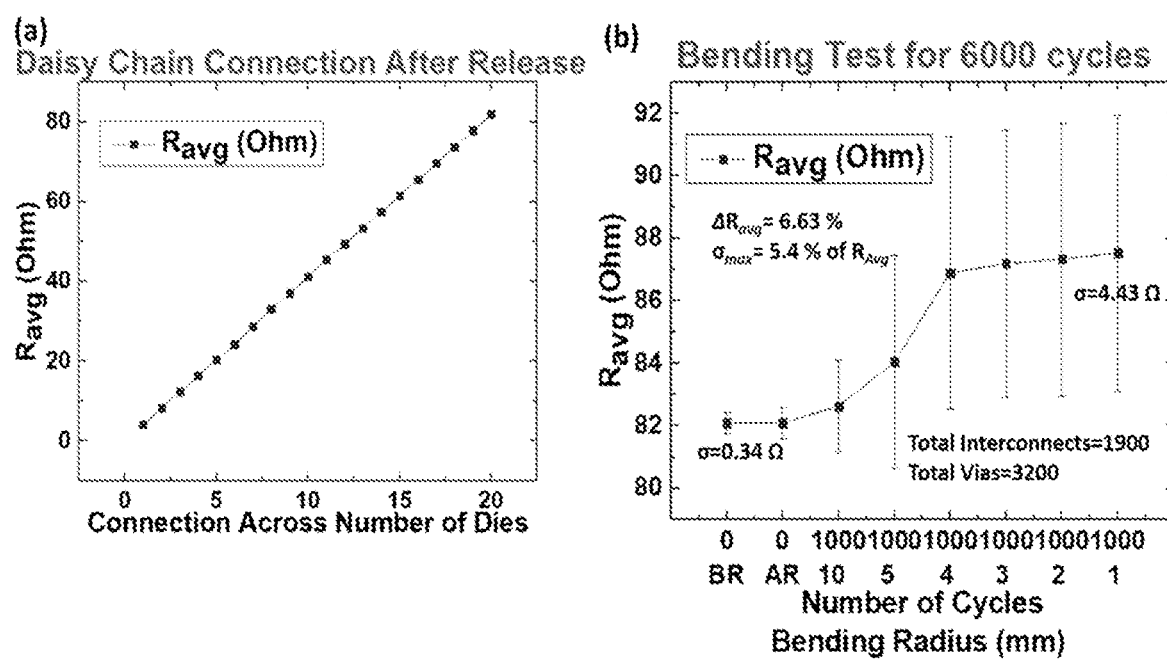
FIG. 16. Mechanical reliability plot for 10×20 array of dies connected with about 40 μm vertically corrugated interconnect pitch on a flexible system in a daisy chain demonstrating in FIG. 16(a) $R_{avg}$ (Ohm) versus connections across number of dies, where an average resistance ($\sigma_{max}$=about 0.23 Ohm) linearly increases with increase in measurement across the number of dies and in FIG. 16(b) $R_{avg}$ (Ohm) for different bending conditions including "Before Release" (BR), "After Release" (AR) of the flexible system from an adhesive layer B and down to about 1 mm bending radius where the system has undergone a total of 6000 bending cycles, and $\Delta R_{avg}$<about 7% with 100% vertically corrugated interconnect yield post bending.

Successful integration is made of 10×20 array of 1 mm² dies (semiconductor components) at about 1.8 mm die pitch with vertically corrugated Cu interconnects (about 5 μm Cu interconnect thickness) at about 40 μm interconnect pitch, connected in daisy chain, as shown in FIG. 15(a). Zoomed-in images of a Si die with pads and corrugated interconnects at about 40 μm pitch are shown in FIGS. 15(b) and (c), respectively. The 10×20 array of dies has a total of 1900 interconnects and 3200 vias. The resistance is measured using a four-point probe across the 20 dies for each of the 10 rows and the average resistance ($R_{avg}$) is plotted, as shown in FIG. 16(a). The $R_{avg}$ linearly increases with the number of dies, with a maximum standard deviation ($\sigma_{max}$)=about 0.23Ω. End-to-end resistances are measured across 20 dies for a total of 80 connections Before Release (BR) and After Release (AR) of the flexible system from an adhesive layer B, as well as, after cyclic bending at about 10, about 5, about 4, about 3, about 2, and about 1 mm bending radius for 1000 cycles each. The $R_{avg}$ is plotted with standard deviation (a), as shown in FIG. 16(b). It is observed that the $\Delta R_{avg}$<about 7% and $\sigma_{max}$<about 5.5% of $R_{avg}$, with no breaking of the vertically corrugated interconnects. This shows the reliability of the vertically corrugated interconnects upon bending to small bending radii.

CONCLUSION

This example sets forth integration of VeRzag and vertically corrugated interconnects in the flexible FOWLP process. Both interconnects demonstrate good connectivity under extreme bending and rolling conditions. VeRzag interconnects are demonstrated to be reliable in a freely rolled sample, whereas vertically corrugated interconnects are demonstrated to be reliable in a sample bent to about 1 mm bending radius for 1000 bending cycles. It should be noted that although the process of forming VeRzag and vertically corrugated interconnects is demonstrated to be integrated with the flexible FOWLP process, the interconnects can be integrated in other processes or flexible systems. The approach of forming VeRzag and vertically corrugated interconnects can yield bendable, stretchable, fine pitch, thin or thick and high-performance interconnects in flexible systems. Moreover, by using a thermally expanded surface of an adhesive tape as a mold, the approach of forming VeRzag interconnects can reduce additional stages of lithography, alignment, and patterning of a surface to obtain random non-planar surface regions on a flexible substrate or a buffer layer. Also, it is demonstrated that vertically corrugated interconnects resist buckling.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A flexible device comprising: a flexible substrate; and an interconnect disposed over the flexible substrate, wherein the interconnect comprises a plurality of corrugations that respectively define a varying vertical displacement of the interconnect along its length, relative to a top surface of the flexible substrate, wherein the interconnect includes multiple interconnected corrugated segments; wherein the corrugated segments include a first segment extending along a first direction parallel to the top surface of the flexible substrate, a second segment extending along a second direction non-parallel to the top surface of the flexible substrate and the second direction forms a non-zero angle with the first direction, and a third segment extending along a third direction parallel or non-parallel to the top surface of the flexible substrate and the third direction forms a non-zero angle with the second direction.

2. The device of claim 1, wherein the flexible substrate has multiple trenches extending into the flexible substrate relative to the top surface of the flexible substrate, and the interconnect extends over the top surface of the flexible substrate and into the trenches of the flexible substrate.

3. The device of claim 1, wherein the flexible substrate has corrugations in a checkerboard pattern, and the interconnect extends over the corrugations of the flexible substrate.

4. The device of claim 1, wherein the interconnect includes multiple interconnected concave segments.

5. The device of claim 4, wherein the flexible substrate has multiple depressions extending into the flexible substrate relative to the top surface of the flexible substrate, and the concave segments extend into corresponding ones of the depressions.

6. The device of claim 1, wherein the interconnect is a first interconnect, the device includes multiple interconnects disposed over the flexible substrate and including the first interconnect, and each of the interconnects has a varying vertical displacement along its length, relative to the top surface of the flexible substrate.

7. The device of claim 6, wherein a pitch between adjacent ones of the interconnects is up to 500 µm.

8. The device of claim 1, wherein the interconnect is a first interconnect, the device includes:
a layer disposed over the flexible substrate and the first interconnect; and a second interconnect disposed over the layer, wherein the second interconnect has a varying vertical displacement along its length, relative to a top surface of the layer.

9. A flexible device comprising: a flexible substrate; a device component embedded in the flexible substrate while an active surface of the device component is exposed from the flexible substrate, wherein the device component includes a bonding pad adjacent to the active surface; a stress buffer layer disposed over the flexible substrate and the device component, wherein the stress buffer layer defines an opening exposing the bonding pad of the device component; and an interconnect disposed over the stress buffer layer and electrically connected to the bonding pad of the device component through the opening of the stress buffer layer, wherein the interconnect comprises a plurality of corrugations that respectively define a varying vertical displacement of the interconnect along its length, relative to a top surface of the stress buffer layer, wherein the stress buffer layer has multiple trenches extending into the stress buffer layer relative to the top surface of the stress buffer layer, and the interconnect extends over the top surface of the stress buffer layer and into the trenches of the stress buffer layer.

10. The device of claim 9, wherein the interconnect includes multiple interconnected corrugated segments.

11. A process of forming a flexible device, comprising: providing a flexible substrate having a surface region; and forming an interconnect over the surface region of the flexible substrate, wherein the interconnect is formed to comprise a plurality of corrugations that respectively define a varying vertical displacement of the interconnect with respect to the surface region, wherein providing the flexible substrate includes forming the flexible substrate having multiple depressions in the surface region, and the interconnect includes multiple interconnected concave segments extending into corresponding ones of the depressions.

12. The process of claim 11, wherein providing the flexible substrate includes forming the flexible substrate having multiple trenches in the surface region, and the interconnect extends over a top surface of the flexible substrate and into the trenches of the flexible substrate.

13. The process of claim 12, wherein forming the flexible substrate includes patterning the flexible substrate to form the trenches.

14. The process of claim 11, wherein providing the flexible substrate includes:
contacting the flexible substrate with a mold including multiple protrusions to form the flexible substrate having the depressions corresponding to the protrusions of the mold.

15. A process of forming a flexible device, comprising: providing a flexible substrate and a device component embedded in the flexible substrate while an active surface of the device component is exposed from the flexible substrate, wherein the device component includes a bonding pad adjacent to the active surface; forming a stress buffer layer over the flexible substrate and the device component, wherein forming the stress buffer layer includes forming an opening in the stress buffer layer exposing the bonding pad of the device component, and further includes forming the stress buffer layer having a surface region; and forming an interconnect over the surface region of the stress buffer layer and electrically connected to the bonding pad of the device component through the opening of the stress buffer layer, wherein the interconnect is formed to comprise a plurality of corrugations that respectively define a varying vertical displacement of the interconnect with respect to the surface region, wherein forming the stress buffer layer includes forming the stress buffer layer having multiple trenches in the surface region, and the interconnect extends over a top surface of the stress buffer layer and into the trenches of the stress buffer layer.

16. The process of claim 15, wherein providing the flexible substrate and the device component includes:
disposing an adhesive layer over a handler;
selectively heating a region of the adhesive layer to form multiple protrusions in the selectively heated region of the adhesive layer;
affixing the device component to the adhesive layer and the handler, with the active surface of the device component facing the adhesive layer;
applying a flexible material over the device component and the adhesive layer; and
curing the flexible material to form the flexible substrate in which the device component is embedded, and having multiple depressions corresponding to the protrusions in the selectively heated region of the adhesive layer.

\* \* \* \* \*